(12) United States Patent
Choe et al.

(10) Patent No.: US 7,586,327 B1
(45) Date of Patent: Sep. 8, 2009

(54) DISTRIBUTED MEMORY CIRCUITRY ON STRUCTURED APPLICATION-SPECIFIC INTEGRATED CIRCUIT DEVICES

(75) Inventors: Kok Heng Choe, Penang (MY); Kar Keng Chua, Penang (MY)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 12/079,368

(22) Filed: Mar. 25, 2008

(51) Int. Cl.
*H01L 25/00* (2006.01)
*H03K 19/177* (2006.01)

(52) U.S. Cl. .............................. 326/41; 326/38; 326/40

(58) Field of Classification Search ............. 326/38–41, 326/113

See application file for complete search history.

(56) References Cited

U.S. PATENT DOCUMENTS

| | | | |
|---|---|---|---|
| 6,924,662 B2 * | 8/2005 | Amarilio et al. | 326/38 |
| 7,243,329 B2 | 7/2007 | Chua et al. | |
| 2003/0234666 A1 * | 12/2003 | Cox | 326/38 |

* cited by examiner

*Primary Examiner*—Anh Q Tran
(74) *Attorney, Agent, or Firm*—Ropes & Gray LLP; Robert R. Jackson

(57) ABSTRACT

A logic module for a structured ASIC is mask-programmable to perform any of a plurality of logic functions or to alternatively function as two static random access memory ("SRAM") cells. Most or all of the circuitry needed to enable the logic module to function as SRAM cells is circuitry that is available for use in logic mode configuration of the module. Similarly, most or all of the logic circuitry of the logic module is put to use to provide the SRAM cells when the module is configured in SRAM mode. The circuitry of the logic module is therefore used very efficiently, whether the module is configured for logic mode or SRAM mode.

20 Claims, 7 Drawing Sheets

DISTRIBUTED MEMORY CIRCUITRY ON STRUCTURED APPLICATION-SPECIFIC INTEGRATED CIRCUIT DEVICES

BACKGROUND OF THE INVENTION

This invention relates to application specific integrated circuit ("ASIC") devices, and more particularly to the type of ASICs that are sometimes referred to as structured ASICs.

Structured ASICs are ASICs that, for any given product family, always have some of the same (or substantially the same) masks used in their fabrication. These masks that are always the same give all ASICs in the product family the same basic structure. Only some of the masks that are used to make particular ASICs in the family are modified or customized for that particular ASIC. This greatly simplifies the task of developing a particular ASIC, and it also greatly reduces the risk that the finished ASIC will not perform as expected.

An example of structured ASICs are those that are used to perform logic and other operations in a manner that is equivalent to a programmed field-programmable gate array ("FPGA") integrated circuit. Chua et al. U.S. Pat. No. 7,243,329 shows examples of some aspects of structured ASICs of this kind.

FPGAs typically include many instances of programmable, general-purpose logic module circuitry. FPPAs also typically include instances of special-purpose circuitry such as blocks of memory (e.g., static random access memory or SRAM) circuitry, digital signal processing ("DSP") circuitry, etc. Another typical feature of FPGAs is a network of programmable interconnection resources, whereby any of the other circuitry on the device can be interconnected in any of many different ways.

A structured ASIC product that may be designed for use in producing structured ASICs that are functionally equivalent to an FPGA product of the type described above (after the FPGA product has been programmed to implement a particular user's logic and other circuitry design) also typically includes many instances of (mask-programmable) general-purpose logic modules. Such a structured ASIC may also include instances of SRAM circuitry. The mask-programmable logic modules are typically used to perform the functions of the programmed logic modules in a functionally equivalent FPGA. The SRAM circuitry is typically used to perform the functions of the SRAM blocks in the functionally equivalent FPGA.

In situations of the type described above, an inefficiency can result in the design or architecture of the structured ASIC due to the fact that the structured ASIC architecture is typically given SRAM blocks similar in size and number to those in the architecture of the related FPGA. However, many user designs for the FPGA (and hence for a functionally equivalent structured ASIC) do not use all the SRAM resources thus provided. This can be due to the fact, for example, that logic and memory utilization rates differ across different user designs and applications. Some applications tend to be more logic intensive, while other applications tend to be more memory intensive. Because it is always difficult to strike an optimal balance point between how much logic and how much memory to include in the architecture of these devices, it would be desirable to provide a structured ASIC logic module flexible enough to perform either logic or memory functions.

One currently known structured ASIC architecture which is designed for use in providing ASICs that are functionally equivalent to programmed FPGAs has approximately 60% of its core area occupied by memory blocks. The remaining core area is occupied by general-purpose logic modules (used for logic and DSP functions). If a user does not use the above-mentioned embedded or dedicated memory in the user's design, a majority of the structured ASIC's core area is wasted. Nevertheless, the user is paying for this extra circuitry that was not used. In addition, leakage power due to the un-used memory blocks causes overall power consumption to increase. Another issue is that the large memory resources cause the general-purpose logic modules to be more spread apart. This tends to increase signal loading and reduces system performance. In some cases, this can also lead to routing congestion on the structured ASIC.

SUMMARY OF THE INVENTION

In accordance with certain possible aspects of the invention, a logic module for a structured ASIC may include pass gate circuitry that is mask-programmable to be either a two-to-one multiplexer or two separate pass gates. The logic module may further include first and second two-input NAND gates, each of which is alternatively mask-programmable to function as an inverter. The logic module may still further include first and second inverter buffers. And the logic module may include mask-programmable interconnection circuitry for allowing interconnection of the pass gates, the NAND gates, and the inverter buffers in any of a plurality of different ways to allow the logic module to perform any of a plurality of different logic functions or to alternatively function as two SRAM cells.

In accordance with certain other possible aspects of the invention, a logic module for a structured ASIC may include two-to-one multiplexer circuitry that is alternatively mask-programmable to serve as two write circuits for two respective SRAM cells. The logic module may further include first and second NAND gates, each of which is mask-programmable to alternatively serve as an inverter. The logic module may still further include first and second inverter buffers. And the logic module may include interconnection circuitry that is mask-programmable to interconnect the multiplexer circuitry, the NAND gates, and the inverter buffers in any of a plurality of different ways to perform any of a plurality of different functions, including a function in which the logic module includes two SRAM cells.

In accordance with still other possible aspects of the invention, a logic module for a structured ASIC may consist essentially of two-to-one multiplexer circuitry, first and second NAND gates, first and second inverter buffers, and interconnection circuitry. The multiplexer circuitry may be mask-programmable to alternatively function as two separate write circuitries for two separate SRAM cells that can be mask-programmably formed in the logic module. Each of the NAND circuitries is mask-programmable to alternatively function as an inverter. The interconnection circuitry is mask-programmable to interconnect the multiplexer circuitry, the NAND gates, and the inverter buffers in any of a plurality of different ways to perform any of a plurality of different functions, one of which functions is provision of two separate SRAM cells in the logic module using a respective one of the NAND gates and a respective one of the inverter buffers to form each respective SRAM cell.

Further features of the invention, its nature and various advantages will be more apparent from the accompanying drawings and the following detailed description.

DETAILED DESCRIPTION

Figure 1:
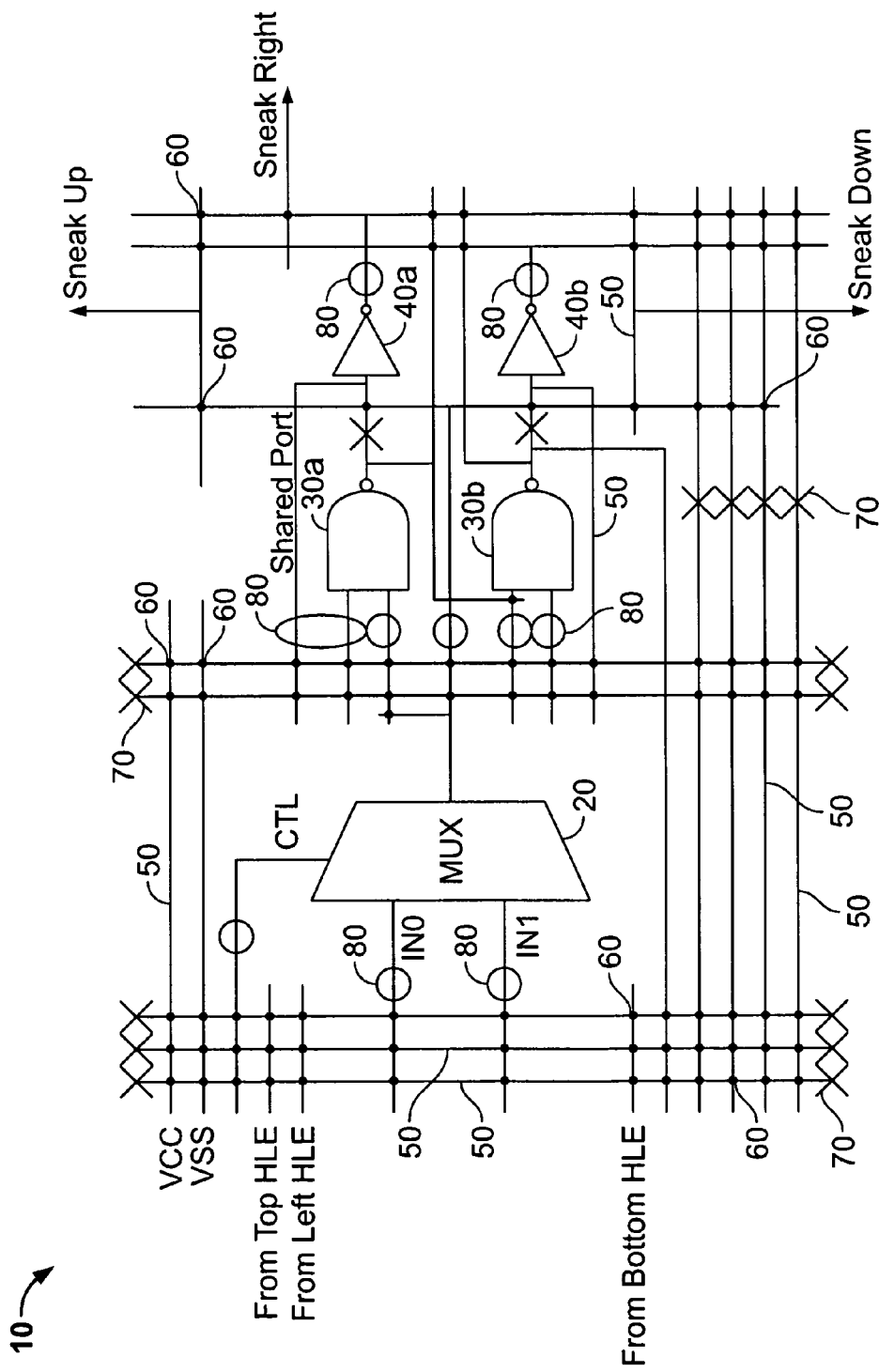
FIG. 1 is a simplified schematic block diagram of a known architecture for a general-purpose logic module used in structured ASICs.

An illustrative, known, general-purpose logic module 10 for inclusion in multiple instances in a structured ASIC architecture is shown in FIG. 1. Logic module 10 is sometimes known as a hard or hybrid logic element ("HLE"), which acronym will be frequently employed herein in the interest of brevity. The major components of HLE 10 include two-input multiplexer ("MUX") 20, two two-input NAND gates 30a and 30b, and two inverting drivers or buffers 40a and 40b. HLE 10 also includes a network of local routing interconnection conductors 50 (only a representative few of which are shown in FIG. 1 with reference number 50 appended). Where two of these conductors cross one another at a dot 60, those conductors are selectively (i.e., optionally) interconnectable to one another by making (or not making) a mask-programmable connection between them. (Again, the reference number 60 is only shown on a few representative ones of these dots, but all of these dots have the same significance throughout FIG. 1 and later FIGS.). The "X" marks 70 on certain conductors are locations where those conductors can be either electrically continuous or electrically broken. This selectivity is also effected by mask-programming (i.e., to either make or not make a connection through the X). Where an X is at the edge of what is shown in FIG. 1, that indicates a selective connection to an aligned conductor in the HLE 10 immediately above or below the HLE shown in FIG. 1. Larger circles or ellipses 80 indicate points in the circuitry at which connections can be made to other circuitry on the ASIC that is more distant from immediate neighbors of depicted HLE 10. Again, these connections are optional or selective, and they are made (or not made) by mask-programming of the device.

Some connections to other immediately adjacent HLEs are hard-wired. These are so-called "sneak" connections. For example, the "sneak right" connection in FIG. 1 is made to a conductor (like the "from left HLE" conductor in FIG. 1) in another HLE that is immediately to the right of the FIG. 1 HLE. The connectivity of the other "sneak" connections will be apparent from this representative description.

The top-most horizontal conductor 50 in FIG. 1 is connected to VCC (a power supply voltage of the structured ASIC). The horizontal conductor directly below that just-mentioned conductor is connected to VSS (a ground potential or ground voltage of the structured ASIC).

HLE 10 is mask-programmable to perform any of several different logic functions, depending, for example, on how its various circuit elements 20, 30, and 40 are connected to one another and to VCC and/or VSS (e.g., by mask-programmable connections 60 and 70). Each HLE 10 can receive one or more inputs from and/or supply one or more outputs to other immediately adjacent HLEs (e.g., via "sneak" connections and/or the marginal X connections 70), and/or more distant circuitry (e.g., input/output circuit blocks, memory blocks, etc., on the ASIC) via connections 80 to longer interconnection conductor resources on the ASICs. Again, these connections (other than the "sneak" connections) are mask-programmable. Although one HLE 10 can only perform a relatively small logic operation, much larger logic operations can be performed by interconnecting as many HLEs as necessary, and these interconnections can be made in many different ways to give the ASIC product a very high degree of flexibility as to how it can be used.

Figure 2:
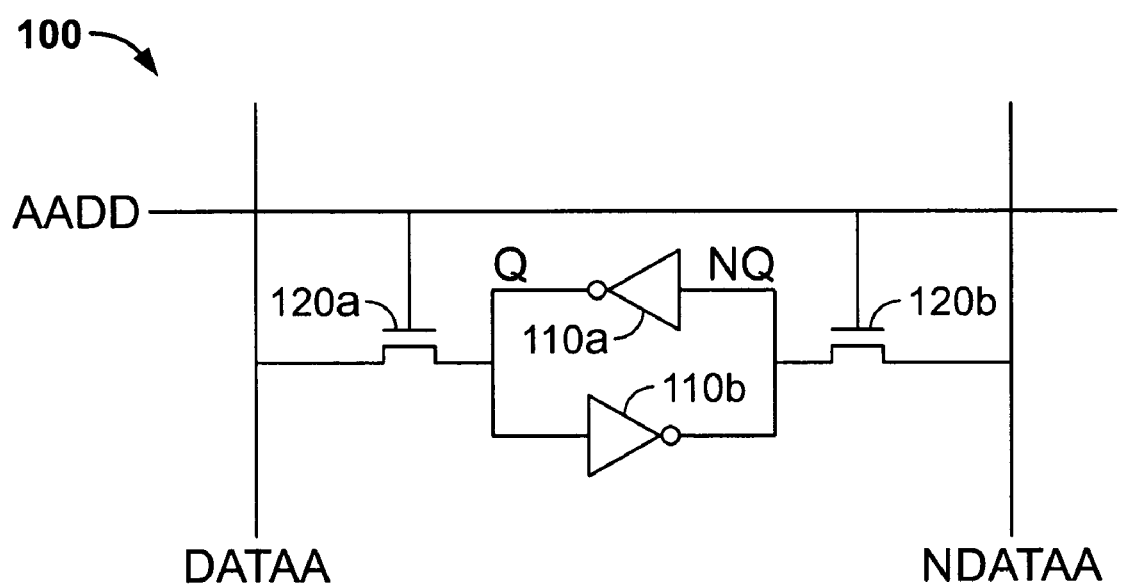
FIG. 2 is a simplified schematic block diagram of known SRAM cell circuitry.

The known HLE architecture shown in FIG. 1 is not efficiently utilized as an SRAM cell. For reference, a known, full, six transistor SRAM cell 100 is shown in FIG. 2. SRAM cell 100 includes two inverters 110a and 110b, which are connected to one another in a closed loop series. The source-drain path of transistor 120a is connected in series between a DATAA line and one of the nodes between inverters 110a and 110b. The source-drain path of transistor 120b is connected in series between the other node between the inverters and an NDATAA line. The gates of transistors 120 are connected to an AADD line. Data applied in complementary form to the DATAA and NDATAA lines can be written into the memory cell (i.e., inverters 110) by using the AADD line to enable transistors 120. Data can be read from the memory cell (without loss of that data in the cell) by using the AADD line to enable transistors 120. The read data then appears in complementary form on the DATAA and NDATAA leads.

Figure 3:
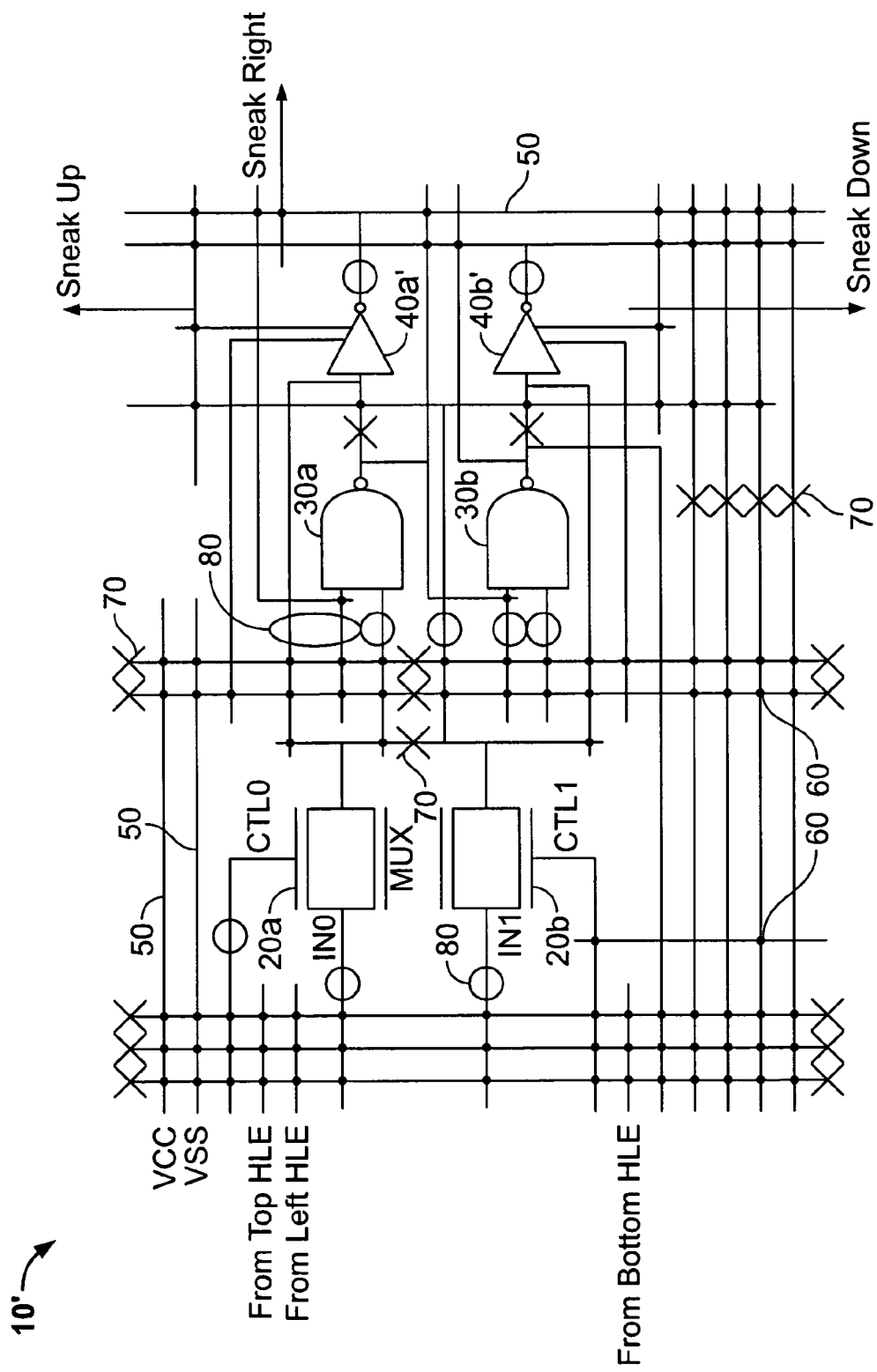
FIG. 3 is a simplified schematic block diagram of an illustrative embodiment of structured ASIC logic module circuitry in accordance with the invention.

FIG. 3 shows an illustrative embodiment of modifications of the FIG. 1 circuitry in accordance with the present invention that allow a single modified HLE 10' to be used (i.e., mask-programmed) either to perform any of the logic functions that HLE 10 can perform or to provide two SRAM cells.

Figure 4:
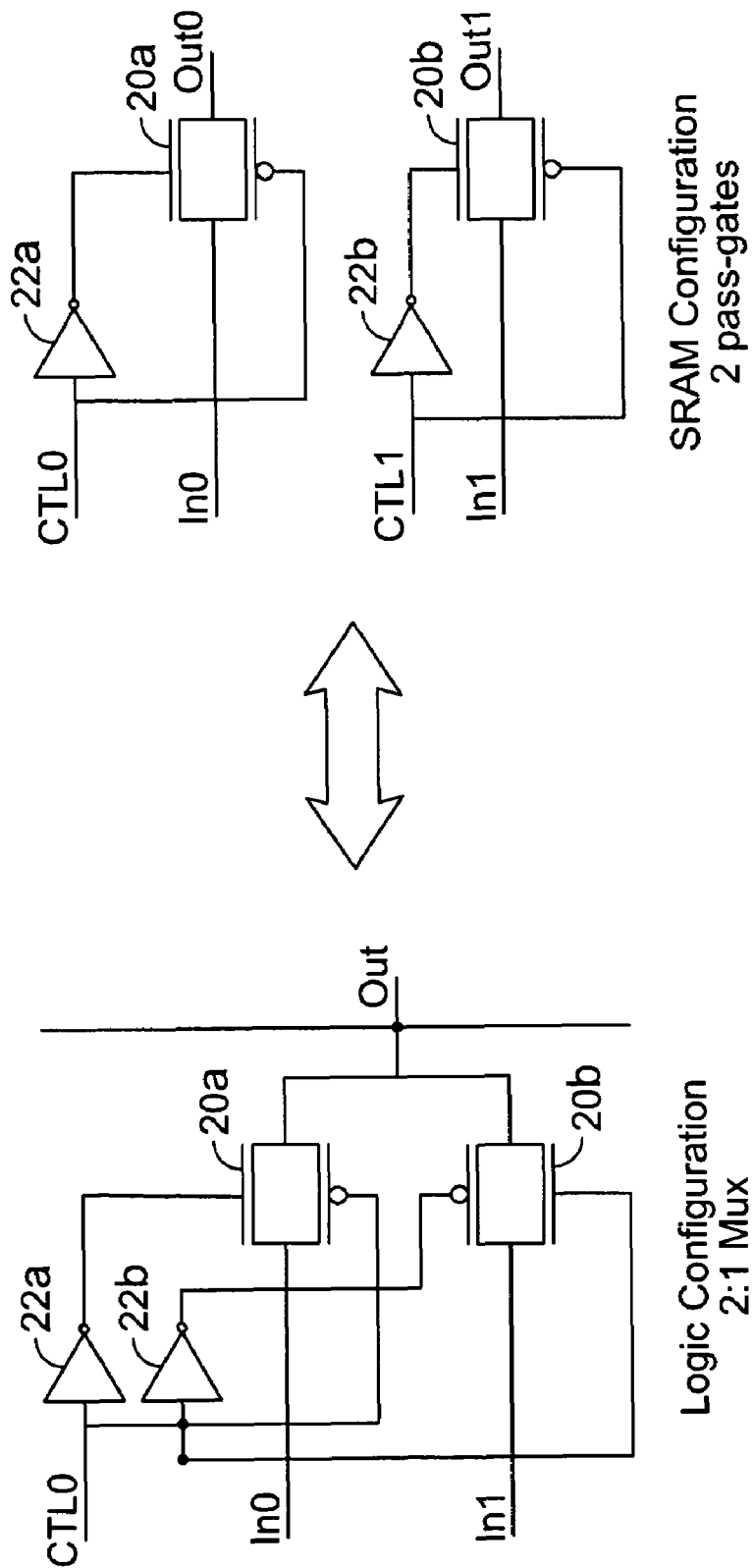
FIG. 4 is a simplified schematic block diagram of an illustrative embodiment of a portion of the FIG. 3 circuitry in two different mask-programmable configurations in accordance with the invention.

A first modification shown in FIG. 3 is to break multiplexer 20 down into two individual pass gates 20a and 20b. The purpose of this modification is to provide a single-ended write port for each of the two SRAM cells in HLE 10' in SRAM mode. Additional details regarding this modification are shown in FIG. 4. On the left, FIG. 4 shows configuration (i.e., mask-programming) of pass gates 20a and 20b as a two-to-one multiplexer for use of HLE 10' in logic mode. On the right, FIG. 4 shows configuration (mask-programming) of this same circuitry for use as two single-ended write ports for two single-bit SRAM cells in HLE 10' in SRAM mode.

Considering the right-hand configuration first, each of pass gates 20 has its own independent control signal CTL0 or CTL1 and associated control signal inverter 22a or 22b. Accordingly, each of pass gates 20a or 20b can pass its input signal IN0 or IN1 to its output terminal OUT0 or OUT1 when (and only when) the pass gate is enabled by its control signal CTL0 or CTL1. In SRAM mode, control signals CTL0 and CTL1 can be used as two separate write address signals (one for each of the two SRAM cells implemented in HLE 10'), and IN0 and IN1 are used as two separate data bits to be written into those two SRAM cells.

On the left in FIG. 4 is reconfiguration of the above-described circuitry for use as a two-to-one multiplexer. In this configuration both of inverters 22a and 22b are driven by the same control signal (CTL0), the polarities of the connections to pass gate 20b are reversed (relative to SRAM mode), and the outputs of the two pass gates are connected together. Thus in this (logic) mode, the multiplexer connects either its IN0 signal or its IN1 signal to its OUT terminal, depending on whether its control signal CTL0 is low or high.

Figure 5:
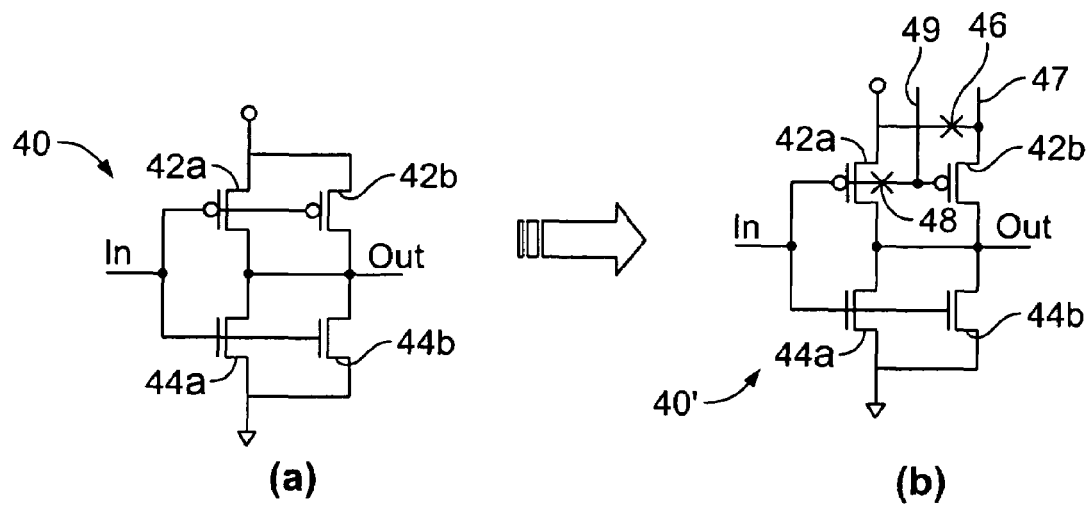
FIG. 5 is a simplified schematic block diagram of an illustrative embodiment of another representative portion of the FIG. 1 circuitry ("(a)" portion of FIG. 5) or the FIG. 3 circuitry ("(b)" portion of FIG. 5), the "(a)" portion being known, and the "(b)" portion being constructed in accordance with the invention.

Further modifications in FIG. 3 are in the area of inverter buffers 40a and 40b (numbered 40a' and 40b' in FIG. 3 because of the modifications being described). These modifications involve breaking the PMOS of each inverter buffer and re-routing the gate connection to the word line (read address information) and the drain connection to the bit line (read data information). FIG. 5 shows some of what has just been referred to.

The (a) part of FIG. 5 shows how a representative inverter buffer 40 in FIG. 1 can be constructed. As shown in this part of FIG. 5, inverter buffer 40 includes PMOS transistors 42a and 42b, whose source-drain paths are connected in parallel with one another between VCC (power supply voltage) and the output node (OUT) of the buffer. Inverter buffer 40 additionally includes NMOS transistors 44a and 44b, whose source-drain paths are connected in parallel with one another between OUT and VSS (ground voltage or ground potential). The gates of all of transistors 42 and 44 are connected to the input terminal of the buffer.

The (b) portion of FIG. 5 shows modification of buffer circuitry 40 (now numbered 40') to give the circuitry additional capabilities in accordance with the present invention. In particular, a mask-programmable connection 46 (like any of earlier-described connections 70) is provided in the link between the drains of transistors 42a and 42b. This allows the drain 47 of transistor 42b to be either connected to the drain of transistor 42a (logic mode) or not connected to the drain of transistor 42a (SRAM mode). Similarly, a mask-programmable connection 48 (again like any of earlier-described connections 70) is provided in the link between the gates of transistors 42a and 42b. This allows the gate 49 of transistor 42b to be either connected to the gate of transistor 42a (logic mode) or not connected to the gate of transistor 42a (SRAM mode).

Figure 6:
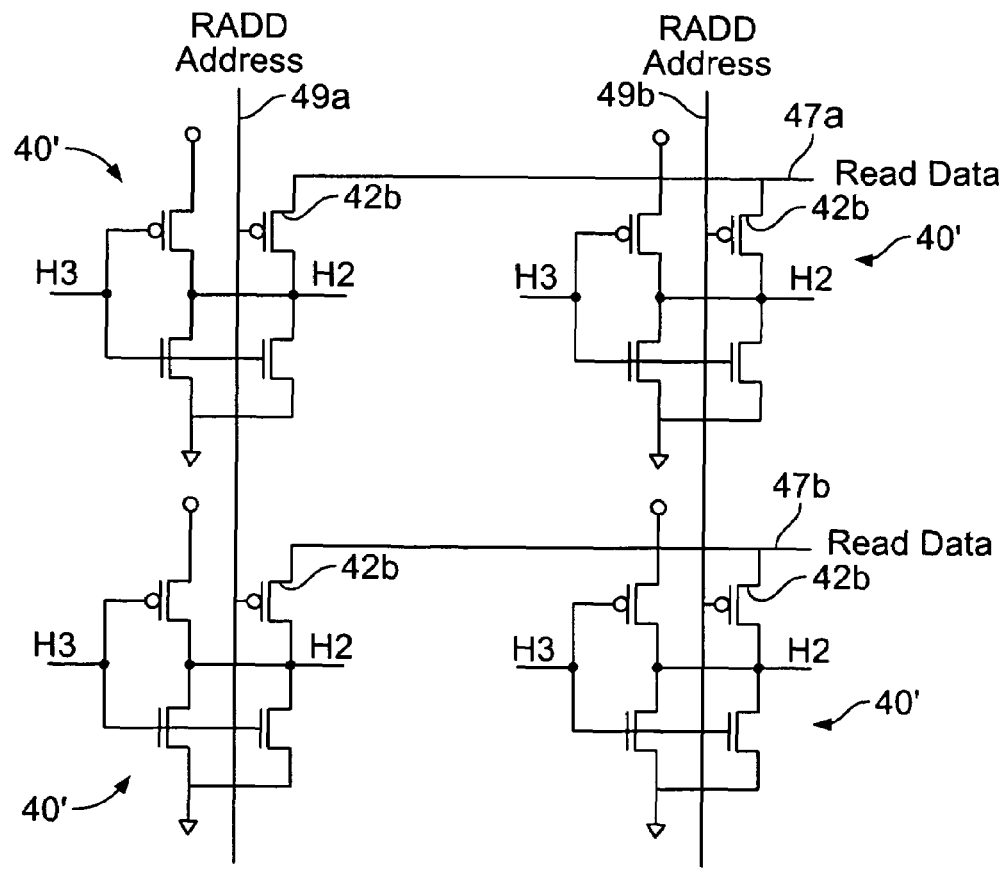
FIG. 6 is a simplified schematic block diagram of an illustrative embodiment of portions of two (or more) structured ASIC logic modules in accordance with the invention.

If circuitry 40' is to be used as a logic mode inverting buffer 40 (or inverter or inverting driver), then circuitry 40' is mask programmed at 46 and 48 to connect the drains of transistors 42a and 42b together, and also to connect the gates of these transistors together. The leads 47 and 49 that respectively extend away from the drain and gate of transistor 42b are not used, and the circuitry is just like circuitry 40. On the other hand, if circuitry 40' is to be used (in SRAM mode) as both an inverting buffer and a read port, then circuitry 40' is programmed at 46 and 48 to disconnect the drain of transistor 42b from the drain of transistor 42a, and to disconnect the gate of transistor 42b from the gate of transistor 42a. Circuitry 40' then looks like any one of the four instances of such circuitry that are shown in FIG. 6. In particular, the gate of each transistor 42b is connected to a read address line (49a or 49b in the representative SRAM array or array fragment shown in FIG. 6), and the drain of each transistor 42b is connected to a read data line (47a or 47b in the representative SRAM array or array fragment shown in FIG. 6).

Figure 7:
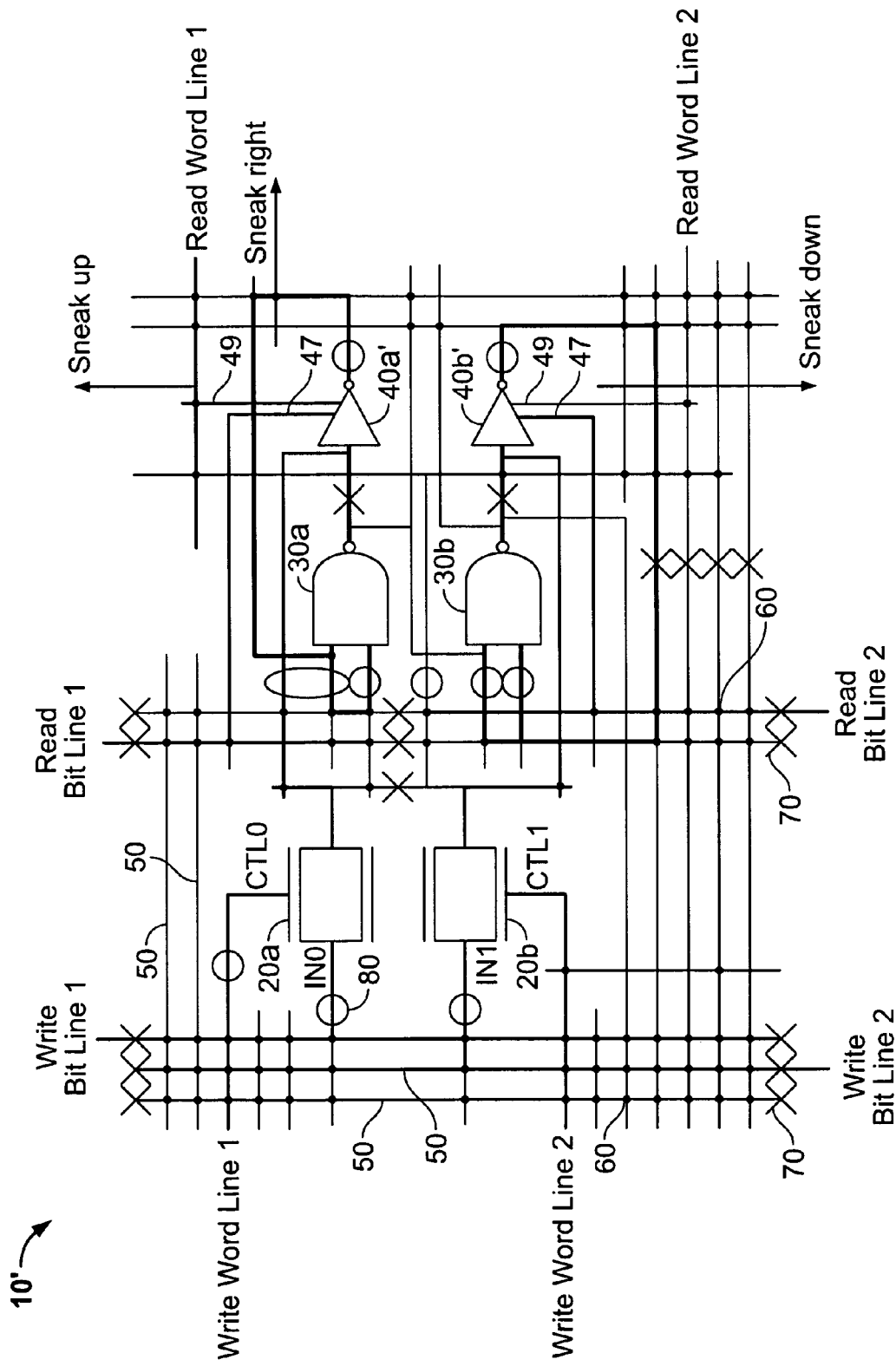
FIG. 7 is another version of FIG. 3 in which an illustrative embodiment of actual mask-programmed routing in accordance with the invention is shown.

FIG. 7 shows an illustrative embodiment of configuration (i.e., mask programming) of HLE 10' in SRAM mode (i.e., to provide two, single-ended, single-bit SRAM cells). (In FIG. 7, the inverters 22a and 22b (FIG. 4) that are ancillary to pass gates 20a and 20b are not shown separately, but they are to be understood as being also represented by the pass gate symbols 20a and 20b.) The interconnections that are actually used in this SRAM mode configuration of HLE 10' are shown with heavier lines than the interconnections that are not used (shown with the lightest lines). In particular, the heaviest line interconnections are those that form the closed loops of the two SRAM cells; the next lighter line connections are those that are used to get address or data information to or from the SRAM cells; and the lightest line connections are those that are not used. The closed loop SRAM cells will be described first.

The upper SRAM cell in FIG. 7 is formed by connecting NAND gate 30a and inverter buffer 40a' in a closed loop series (although the PMOS transistor 42b in buffer 40a' is broken out of this loop as discussed above in connection with FIGS. 5 and 6). In particular, the primary or normal output of inverter 40a' is connected back to both inputs to NAND gate 30a (which consequently functions as an inverter), and the output of that NAND gate is connected to the input to buffer 40a'. These are the heaviest line connections shown in the upper part of FIG. 7. The write data path in this part of FIG. 7 includes the line labelled "Write Bit Line 1", the IN0 connection from that line to pass gate 20a, and the output from that pass gate to the input terminal of inverter 40a'. Medium-weight lines are used for these connections in FIG. 7. The write address line for this part of FIG. 7 includes the line labelled "Write Word Line 1" leading to the control input CTL0 for pass gate 20a. Medium-weight lines are again used for these connections. The read data line for this part of FIG. 7 includes the output 47 from circuitry 40a', the connection from that line to the line labelled "Read Bit Line 1", and that last-mentioned line. Once again, medium-weight lines are used for these connections. The read address line for this part of FIG. 7 is the line labelled "Read Word Line 1" and connection 49 from that line to circuitry 40a'. Medium-weight lines are again used.

The second SRAM cell in HLE 10' in FIG. 7 is formed by the closed loop series connection of inverting buffer circuitry 40b' (again excluding the PMOS transistor 42b in that circuitry) and NAND gate 30b. Thus the main or primary output of buffer 40b' is connected back to both input terminals of NAND gate 30b (which consequently functions as an inverter), and the output of the NAND gate is connected to the input of inverting buffer 40b'. The heaviest weight lines are used for the connections in this closed loop. Medium-weight lines are used for all of the other paths mentioned below in this paragraph. The write data path for this second SRAM bit includes "Write Bit Line 2" and the IN1 connection from that line to pass gate 20b. The associated write address path is "Write Word Line 2" and the CTL1 connection to pass gate 20b. The read data path for the lower SRAM bit is output 47 from circuitry 40b', the connection from that output to "Read Bit Line 2", and that last-mentioned line itself. The associated read address path includes "Read Word Line 2" and input 49 to circuitry 40b'.

When it is desired to write data into the upper SRAM cell in FIG. 7, that data is applied to "Write Bit Line 1", and "Write Word Line 1" is asserted to enable pass gate 20a. This applies the data to be written to the input terminal of inverting buffer 40a', which over-rides any possibly different data previously stored in the upper SRAM cell. The upper SRAM cell continues to hold this new data after "Write Word Line 1" is no longer asserted and IN0 is accordingly disconnected from the upper SRAM cell.

When it is desired to read data from the upper SRAM cell, "Read Word Line 1" is asserted to enable PMOS transistor 42b in circuitry 40a'. This causes a signal indicative of the data stored in the upper SRAM cell to be applied to "Read Bit Line 1". (Note that in this embodiment the read bit line should be pre-discharged to ground instead of pre-charged to VCC.)

The write and read operations of the lower SRAM cell are similar but can be separate or independent (because separate write and read address and data lines ("Write Word Line 2", "Write Bit Line 2", "Read Word Line 2", and "Read Bit Line 2") are provided for this lower cell.

Of course, if it is not desired to use HLE 10' in SRAM mode as shown in FIG. 7, then HLE 10' can instead be configured (i.e., mask-programmed) to perform any logic function that HLE 10 can perform.

Figure 8:
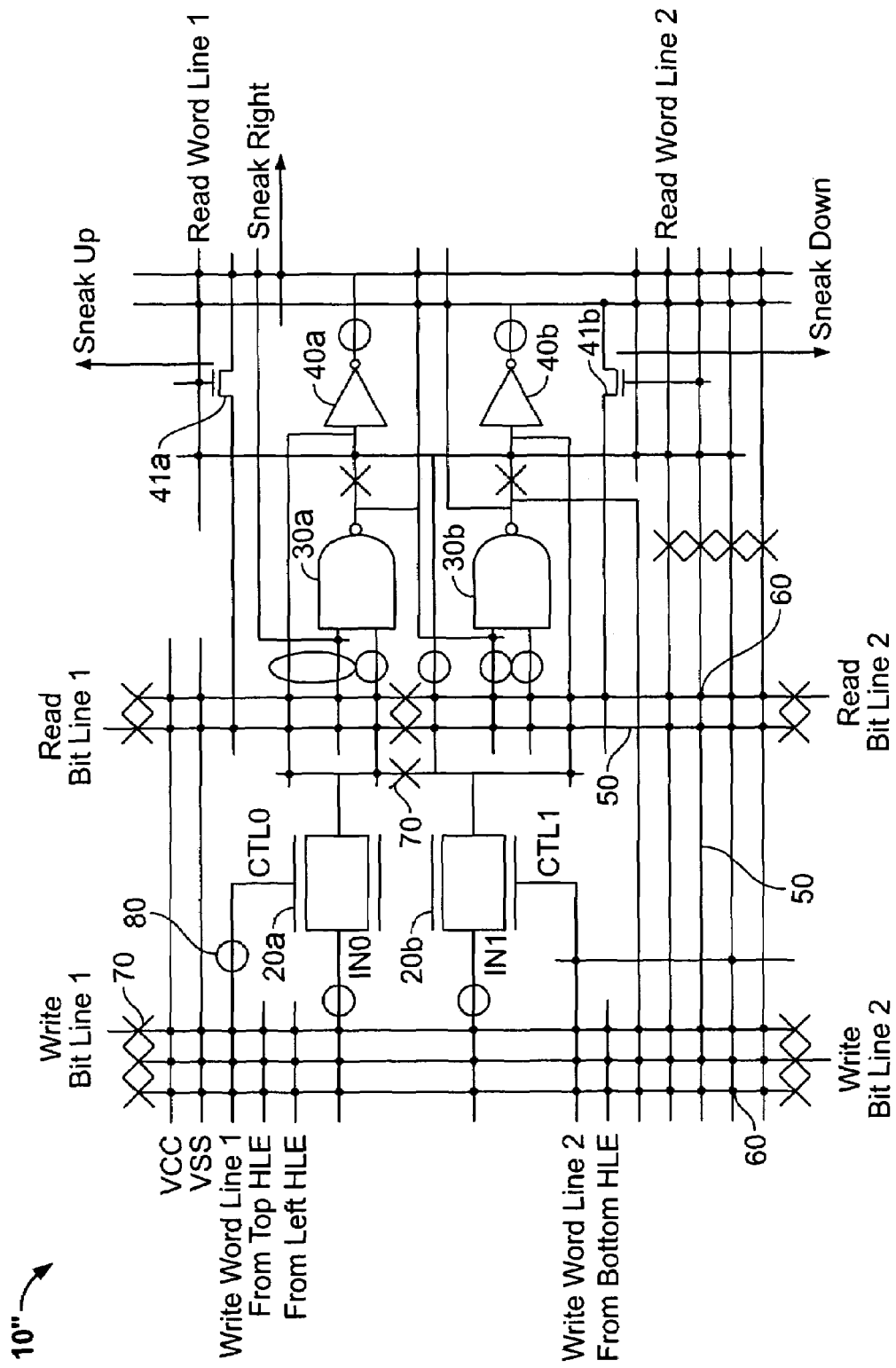
FIG. 8 is similar to FIG. 3 for another illustrative embodiment in accordance with the invention.

FIG. 8 shows an alternative embodiment in which HLE 10" includes somewhat different circuitry than HLE 10' for reading data from the SRAM cells in the HLE in SRAM mode. In HLE 10" inverting buffers 40a and 40b are unmodified from HLE 10. Instead, for reading data from each SRAM cell an NMOS transistor 41a or 41b is added as shown in FIG. 8. The same conductors that are used in FIG. 7 for "Read Word Line 1", "Read Bit Line 1", "Read Word Line 2", and "Read Bit Line 2" can be used again in FIG. 8 for those same purposes. It will then be apparent how the gate of transistor 41a is connected to "Read Word Line 1", and how the source-drain path of transistor 41a is connected from the upper SRAM cell to "Read Bit Line 1" in FIG. 8. Similarly, it will be apparent how the gate of transistor 41b is connected to "Read Word Line 2", and how the source-drain path of transistor 41b is connected from the lower SRAM cell to "Read Bit Line 2" in FIG. 8.

Although somewhat different circuitry is provided for reading data from the SRAM cells in FIG. 8 (as compared to FIG. 7), writing data into the SRAM cells in FIG. 8 is unchanged from FIG. 7.

It will be appreciated that only relatively small modifications and additions to the FIG. 1 HLE 10 circuitry are required to give that circuitry considerable additional capability as shown, for example, in FIG. 7 or FIG. 8. This additional capability enables each HLE 10' or 10" to operate as two single-bit SRAM cells with independent data writing and reading. Each SRAM cell is formed from one of the existing NAND gates 30 and one of the existing inverters 40, forming a back-to-back latch as in the typical SRAM cell design (see FIG. 2). Existing local interconnects 50 plus existing and a few additional mask-programmable options 60/70/46/48/etc. allow construction of SRAM circuitry with word-line, bit-line, and internal latch connections. The NAND and INV latch pair (e.g., as in FIG. 7) forms an ideal combination where both read and write margins are improved. This is so because the strong INV drives the bit line during read, while the weaker NAND gate eases the write operation into the soft SRAM cell. (The SRAM cell is referred to as "soft" because it is not dedicated exclusively to providing SRAM. As has been said, if HLE 10' or 10" is not needed for SRAM, it can instead be used for logic (e.g., any logic operation that HLE 10 can be configured (i.e., mask-programmed) to perform). In contrast, the term "hard" is sometimes used for circuitry that is dedicated to performing a particular function.)

In sum, the above shows that two complete SRAM cells can be built from one single HLE cell 10' or 10" as shown in FIG. 7 or FIG. 8. This solution uses all logic available in the HLE 10 cell and therefore delivers high-density soft SRAM using HLEs. Any number of HLEs can be used in any arrangement to provide SRAM arrays of any desired size (including any desired SRAM array width and/or depth), although it will be appreciated that for very high-capacity SRAM memory dedicated SRAM circuitry may be more efficient. For example, FIG. 6 shows an example of a small array that is two bits wide and two bits deep. An array like this can be formed from two HLEs 10' or 10" arranged side by side or one above the other. Any of the Write Word, Write Bit, Read Word, and/or Read Bit Lines for multiple cells/HLEs can be tied together or kept separate from one another as desired. Also, these lines can continue from HLE to HLE, if desired, in any desired arrangement to form an SRAM array having any desired pattern of data writing and/or reading.

Some of the advantages of the invention are as follows. The invention provides flexibility of SRAM cell placement in the floor-plan of the structured ASIC (because any HLEs anywhere on the device can be used for SRAM). The invention increases the memory capacity of the structured ASIC beyond the capacity of the hard SRAM blocks on the device (again because any HLEs can be used to add to the memory capacity of the device). The soft SRAM can be configured in different sizes (including different depths and/or widths) to fit exactly the user's requirements. The invention provides flexibility between logic utilization and soft SRAM cell utilization. The invention has a small die size penalty on the existing HLE cell design.

It will be understood that the foregoing is only illustrative of the principles of the invention and that various modifications can be made by those skilled in the art without departing from the scope and spirit of the invention. For example, the particular arrangements of local interconnections 50 and mask-programmable connection options 60, 70, and 80 shown in FIGS. 1, 3, 7, and 8 are only illustrative, and other arrangements can be used instead if desired.

The invention claimed is:

1. A logic module for a structured ASIC comprising:
   pass gate circuitry that is mask-programmable to be either a two-to-one multiplexer or two separate pass gates;
   first and second two-input NAND circuitries, each of which is alternatively mask-programmable to function as an inverter;
   first and second inverter buffer circuitries; and
   mask-programmable interconnection circuitry for allowing interconnection of the pass gate circuitry, the NAND circuitries, and the inverter circuitries in any of a plurality of different ways to allow the logic module to perform any of a plurality of different logic functions or to alternatively function as two SRAM cells.

2. The logic module defined in claim 1 wherein, when the logic module is mask-programmed to function as two SRAM cells, each of the NAND circuitries is mask-programmed to function as an inverter, and the interconnection circuitry is mask-programmed to connect each of the NAND circuitries in a closed loop series with a respective one of the inverter buffer circuitries.

3. The logic module defined in claim 1 wherein, when the logic module is mask-programmed to function as two SRAM cells, the pass gate circuitry is mask-programmed to be two separate pass gates.

4. The logic module defined in claim 3 wherein, when the pass gate circuitry is mask-programmed to be two separate pass gates, the interconnection circuitry is mask-programmed to connect each of the pass gates to a respective one of the SRAM cells as write circuitry for the respective SRAM cell.

5. The logic module defined in claim 4 wherein each of the pass gates includes a control input lead and data input and output leads, the pass gate passing data from its data input lead to its data output lead only when a control signal applied to the control input terminal has a pass-gate-enabling state.

6. The logic module defined in claim 5 wherein the output lead of each of the pass gates is connected to an input terminal of a respective one of the inverter buffer circuitries.

7. The logic module defined in claim 1 wherein each of the inverter buffer circuitries comprises a plurality of transistors, and wherein the interconnection circuitry is mask-programmable to allow one of the transistors in each of the inverter buffer circuitries to be used as read circuitry for an SRAM cell that includes other transistors of that inverter buffer circuitry.

8. The logic module defined in claim 1 further comprising:
first and second transistors, each of which is mask-programmably connectable to a respective one of the SRAM cells for use as read circuitry for the respective SRAM cell.

9. A logic module for a structured ASIC comprising:
two-to-one multiplexer circuitry that is alternatively mask-programmable to serve as two write circuitries for two respective SRAM cells;
first and second NAND circuitries, each of which is mask-programmable to alternatively serve as an inverter;
first and second inverter buffer circuitries; and
interconnection circuitry that is mask-programmable to interconnect the multiplexer circuitry, the NAND circuitries, and the inverter buffer circuitries in any of a plurality of different ways to perform any of a plurality of different functions, including a function in which the logic module includes two SRAM cells.

10. The logic module defined in claim 9 wherein each of the SRAM cells is formed by mask-programmably connecting a respective one of the NAND circuitries in a closed loop series with a respective one of the inverter buffer circuitries.

11. The logic module defined in claim 10 wherein the write circuitry for each of the SRAM cells is mask-programmably connected between an output terminal of the NAND circuitry in that SRAM cell and an input terminal of the inverter buffer circuitry in that SRAM cell.

12. The logic module defined in claim 9 further comprising:
mask-programmable circuitry for providing read circuitry for each of the SRAM cells.

13. The logic module defined in claim 12 wherein the read circuitry for each of the SRAM cells comprises a transistor that is mask-programmably partly separated from the inverter buffer circuitry that forms part of that SRAM cell.

14. The logic module defined in claim 13 wherein, for each of the SRAM cells, the respective transistor has a source-drain path that is connected at one of its ends to an output terminal of the inverter buffer circuitry that forms part of that SRAM cell.

15. The logic module defined in claim 14 wherein the read circuitry for each of the SRAM cells comprises a transistor for each SRAM cell that is in addition to transistors employed in the multiplexer circuitry, the NAND circuitries, and the inverter buffer circuitries.

16. A logic module for a structured ASIC consisting essentially of:
two-to-one multiplexer circuitry that is alternatively mask-programmable to function as two separate write circuitries for two separate SRAM cells that can be mask-programmably formed in the logic module;
first and second NAND circuitries, each of which is mask-programmable to alternatively function as an inverter;
first and second inverter buffer circuitries; and
interconnection circuitry that is mask-programmable to interconnect the multiplexer circuitry, the NAND circuitries, and the inverter buffer circuitries in any of a plurality of different ways to perform any of a plurality of different functions, one of which functions is provision of two separate SRAM cells in the logic module using a respective one of the NAND circuitries and a respective one of the inverter buffer circuitries to form each respective SRAM cell.

17. The logic module defined in claim 16 wherein, for each of the SRAM cells, a portion of the inverter buffer circuitry that forms part of that SRAM cell is mask-programmably partly separated from that inverter buffer circuitry for use as read circuitry for that SRAM cell.

18. The logic module defined in claim 16 wherein, in each of the SRAM cells, the interconnection circuitry is mask-programmed to connect a respective one of the NAND circuitries and a respective one of the inverter buffer circuitries in a closed loop series.

19. The logic module defined in claim 18 wherein, in each of the SRAM cells, the write circuitry for that SRAM cell is connected to an output terminal of the NAND circuitry that forms part of that SRAM cell.

20. The logic module defined in claim 16 wherein when the multiplexer circuitry is mask-programmed to function as two separate write circuitries, each of those write circuitries is configured as pass gate circuitry.

* * * * *